United States Patent [19]

Skudera, Jr.

[11] Patent Number: 5,734,326
[45] Date of Patent: Mar. 31, 1998

[54] RECOGNITION TAG FOR USE IN A SYSTEM FOR IDENTIFYING DISTANT ITEMS

[75] Inventor: William J. Skudera, Jr., Oceanport, N.J.

[73] Assignee: The United States of America as represented by the Secretary of the Army, Washington, D.C.

[21] Appl. No.: 346,594

[22] Filed: Nov. 28, 1994

[51] Int. Cl.⁶ ................................................. G08B 13/14
[52] U.S. Cl. ................. 340/572; 310/312 R; 310/313 B; 310/313 D
[58] Field of Search ................... 340/572, 543, 340/426, 825.31, 825.34; 310/313 R, 313 D, 313 B; 342/44; 333/142

[56] References Cited

U.S. PATENT DOCUMENTS

| | | | |
|---|---|---|---|
| 4,059,831 | 11/1977 | Epstein | 310/313 R |
| 4,096,477 | 6/1978 | Epstein et al. | 342/44 |
| 4,396,851 | 8/1983 | Kishimoto et al. | 310/313 R |
| 4,746,830 | 5/1988 | Holland | 310/313 D |
| 4,764,701 | 8/1988 | Garbacz et al. | 310/313 R |
| 5,353,304 | 10/1994 | Mochizuki | 310/313 D |
| 5,359,250 | 10/1994 | Toda | 310/313 R |
| 5,374,863 | 12/1994 | Mochizuki et al. | 310/313 D |

OTHER PUBLICATIONS

William J. Skudera, Jr., "Sequential Circuitry For Recreating CW Components From Chirp-Z Pulses", Ser. No. 07/977,354, Filed Nov. 17, 1992;.

William J. Skudera, Jr., "SAW Tapped Delay Lines For New Potential Circuit Applications", 42nd Annual Frequency Control Symposium —1988.

L. Reindl, W. Ruile, "Programmable Reflectors for SAW-ID-Tags", Siemens AG, Corporate Research and Development, Munich, Germany, 1993 Ultrasonics Symposium.

Primary Examiner—Brent A. Swarthout
Assistant Examiner—Benjamin C. Lee
Attorney, Agent, or Firm—Michael Zelenka; John M. O'Meara

[57] ABSTRACT

Passive recognition tags are disclosed that function along with a transceiver and a processor in a system which identifies distant items. Each tag includes a SAW substrate on which sync and tap transducers are commonly connected between positive and negative buses across which an interrogating signal is applied through an antenna. In response to that signal, in phase identification code signals pass to the antenna from both the sync transducer and the tap transducers. Transducer spacing is minimized relative to acoustic reflection considerations by disposing the tap transducers in a plurality of channels which are aligned in parallel across the width of the substrate on both output sides of the sync transducer.

6 Claims, 2 Drawing Sheets

RECOGNITION TAG FOR USE IN A SYSTEM FOR IDENTIFYING DISTANT ITEMS

GOVERNMENT INTEREST

The invention described herein may be manufactured, used, and licensed by or for the United States Government for governmental purposes without payment to me of any royalties thereon.

BACKGROUND OF THE INVENTION

The present invention relates to item identification systems, and more particularly to a passive recognition tag for utilization therein.

Item identification systems are well known in the art. Many such systems utilize passive recognition tags bearing bar codes which must be physically contacted with a scanner. Systems having passive tags which can be interrogated from a distance are also known, however, the operable distance is quite limited due to the low level signals which are transmitted by those tags and the level of such signals cannot be enhanced upon reception. Other systems utilize active recognition tags which present obvious problems in that each tag must be powered such as by a battery.

SUMMARY OF THE INVENTION

It is the general object of the present invention to derive an enhanced identification code signal from a passive recognition tag that is utilized in an item identification system.

It is a specific object of the present invention to accomplish the general object on a SAW (surface acoustic wave) substrate.

It is another specific object of the present invention to enhance the range of the item identification system by deriving a high level response from recognition tags therein which are dedicated to a coded interrogating signal of that system.

To accomplish these and other objects in accordance with the present invention, dual identification code signals are derived within each recognition tag and applied in phase to an antenna thereof. In the preferred embodiments, a synchronous (sync) transducer and a plurality of tap transducers are disposed on a SAW substrate, between the same positive and negative buses. Coded interrogating signals are derived in a particular embodiment by modulating a coherent carrier through a shift register, and the inverse of that code is set in the recognition tag to derive a high level correlated RF pulse response thereto.

The scope of the present invention is only limited by the appended claims for which support is predicated on the preferred embodiments set forth hereafter in the following description and the attached drawings wherein like reference characters relate to like parts throughout the Figures.

DESCRIPTION OF THE PREFERRED EMBODIMENTS

SAW devices for tapped delay line applications conventionally include a piezoelectric substrate on which a sync transducer is aligned with a plurality of tapped transducers. Separate positive and negative buses for each type of transducer are disposed on the substrate and electrodes extend therefrom over the substrate in regard to each transducer. The sync transducer electrodes are electrically actuated to generate a SAW in the substrate, which propagates therethrough to the tapped transducers with the electrodes thereof being electrically actuated thereby.

Figure 1:
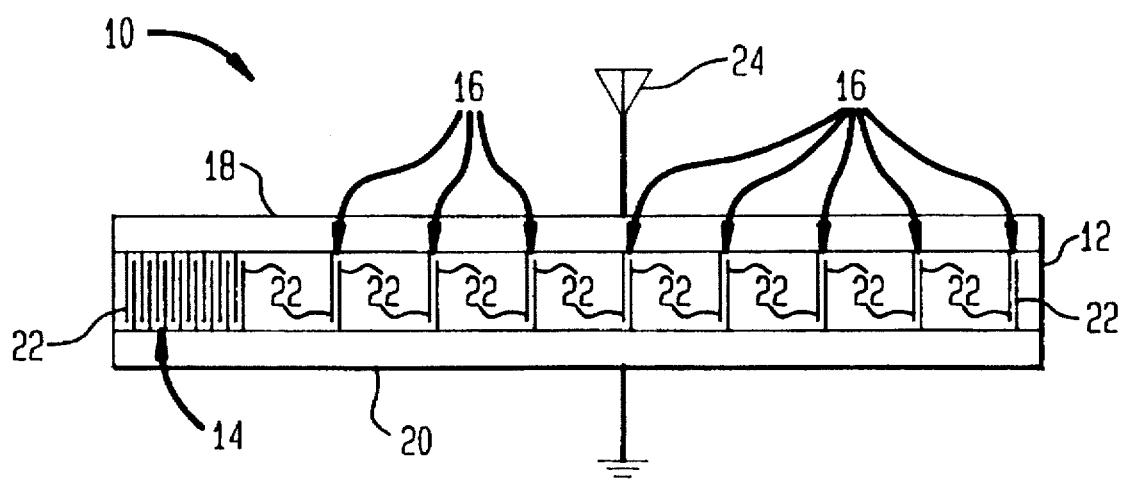
FIG. 1 is the schematic diagram for the SAW substrate in one preferred recognition tag embodiment of the invention.

A passive recognition tag 10 in accordance with the invention is shown in FIG. 1. It includes a piezoelectric substrate 12 on which a sync transducer 14 and a plurality of tap transducers 16 are aligned. The boundaries of substrate 12 are determined in accordance with the specific design of the recognition tag 10 and are not emphasized in FIGS. 1 and 3. Only a single pair of positive and negative buses 18 and 20 are disposed on the substrate 12, with electrodes 22 extending therefrom over the substrate 12 relative to each transducer. Each electrode 22 is connected to one of the buses 18 or 20, and extends between these buses for substantially the distance existing therebetween. An antenna 24 is connected across the buses 18 and 20 to receive or transmit signals.

Figure 2:
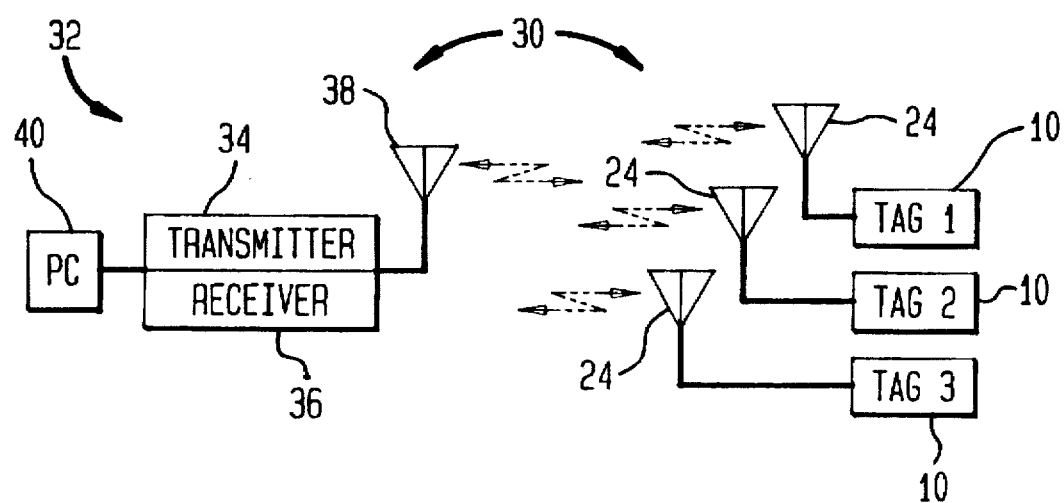
FIG. 2 is the block diagram for one preferred item identification system embodiment of the invention.

Each recognition tag 10 functions within an item identification system 30 to locate one or more of an item, as illustrated in FIG. 2. In system 30, a transceiver 32 includes a transmitter 34 and receiver 36, which operate cooperatively through a common directional antenna 38. An interrogating signal, such as a RF pulse, passes from transmitter 34 to antenna 38 which transmits it to a location of interest. The antennae 24 of the recognition tags 10 on the items at the location of interest, pick up the interrogating signal and in response thereto, each tag 10 generates a signal representation for the particular code which identifies its item. All such signal representations are transmitted back to antenna 38 by the antennae 24 and pass to receiver 36 which derives all the codes of the items at the location of interest. These codes are then directed to a conventional processor (not shown) which discriminates relative to each code and determines if any of the items at the location of interest are to be noted. Any well known comparison check could be utilized by the conventional processor to make these determinations. An unconventional approach to such code discrimination may also be utilized, as will be discussed later herein.

On each recognition tag 10, the buses 18 and 20 are common to both the sync and tap transducers 14 and 16, whereas such buses are separate and distinct on conventional SAW devices having tap transducers. The common bus arrangement provides an enhanced or magnified signal output from the recognition tag 10 by connecting the antenna 24 directly to both the sync and tap transducers 14 and 16. Consequently, the interrogating signal simultaneously drives both the sync and tap transducers 14 and 16, from which SAW signals are imposed on the substrate 12. A replica of the RF pulse is imposed by the sync transducer 14, while a PN (pseudo noise) code is imposed by the tap transducers 16 in accordance with the connecting sequence of their electrodes 22 to the positive and negative buses 18 and 20. When the SAW signal replica of the RF pulse reaches the tap transducers 16, the electrodes 22 thereof respond through the positive and negative buses 18 and 20, to derive the same PN code at the antenna 24. When the SAW signal of the PN code reaches sync transducer 14, the electrodes 22 thereof respond by directing the PN code through the buses 18 and 20 to the antenna 24. Because both SAW signals are imposed on the substrate 12 by the RF pulse of the interrogating signal, each encounters the same propagation characteristics thereon. Consequently, the PN codes are identical and arrive in phase at the antenna 24, so that the tag code signal output therefrom is enhanced.

Figure 3:
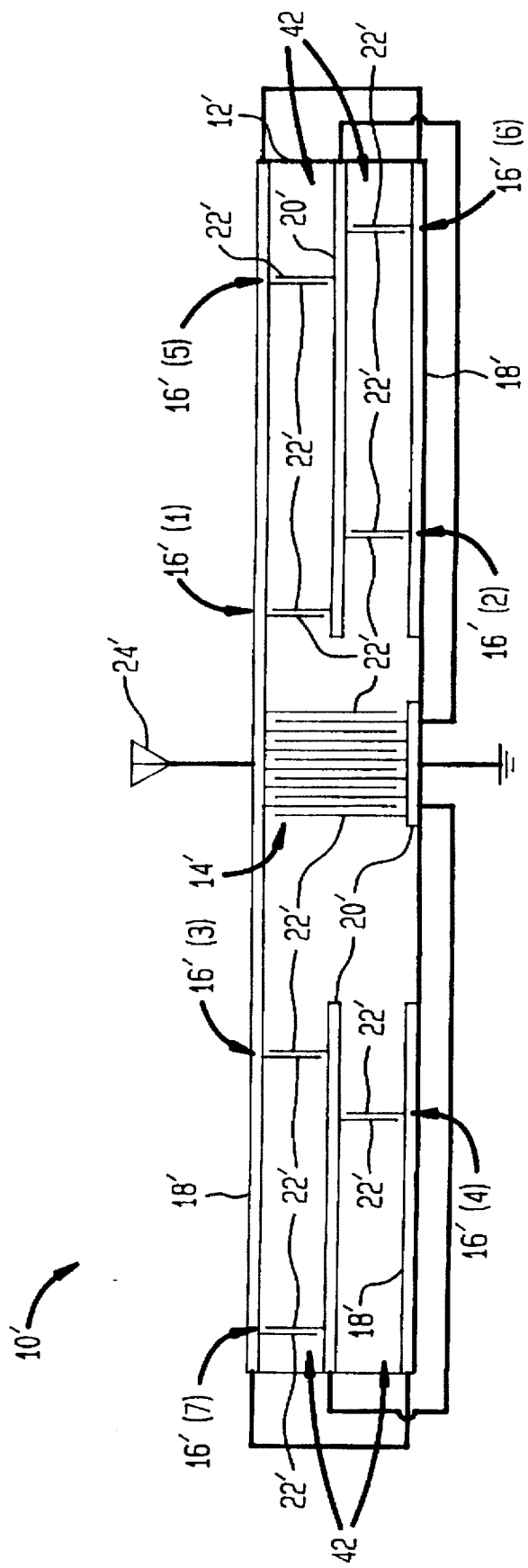
FIG. 3 is the schematic diagram for the SAW substrate in other preferred recognition tag embodiments of the invention.

Those skilled in the art of SAW devices will be unfamiliar with the same pair of positive and negative buses 18 and 20 being commonly utilized by both the sync and tap transducers 14 and 16 in FIG. 1. However, such artisans will readily appreciate that the number of available codes and the signal processing gain will both be increased by increasing the number of tap transducers 16. It will also be appreciated that the tap transducers 16 must be separated by a minimum spacing to avoid acoustic reflection problems and therefore, the length of the SAW substrate 12 in FIG. 1 will increase proportionally as the number of tap transducers 16 is increased. This proportional length increase can be substantially ameliorated as shown in FIG. 3, where the sync transducer 14' is disposed along the SAW propagation path to provide for SAW outputs therefrom and SAW inputs thereto on both sides thereof. To accomplish this, the tap transducers 16' are disposed in a plurality of channels 42 which are aligned in parallel across the width of the substrate 12' on both output sides of the sync transducer 14'. This arrangement provides for the SAW propagation distance between consecutive tap transducers 16'(1), 16'(2), 16'(3), 16'(4) and so on, to be greatly reduced without encountering tap reflection problems by sequentially distributing those transducers to the channels 42. Of course, such sequential distribution requires that at least some consecutive tap transducers 16' must be distributed alternately across the sync transducer 14' on opposite sides thereof along the SAW propagation path.

To increase the range of identification system 30, the transmitter 34 shown in FIG. 2 can be arranged to emit a conventional phase coded interrogating signal. The phase of a coherent carrier would be modulated with a particular code through a shift register (not shown) which is digitally set by a processor (PC) 40. The inverse of each such interrogating signal code would have at least one tag 10 dedicated thereto. Then when any interrogating signal code is received by any of the particular tag 10 dedicated thereto, a correlated RF pulse of very high amplitude is derived due to correlation gain, and directed back to the receiver 36, through the antennae 24 of that tag 10. This RF pulse is identified within the receiver 36 by a threshold detector (not shown) and PC 40 is notified thereof. Due to the very high amplitude of that RF pulse, the operating range of system 30 is enhanced.

Those skilled in the art will appreciate without any further explanation that within the concept of this invention many modifications and variations are possible to the above disclosed embodiments of the passive item recognition tag and identification system therefor. Consequently, it should be understood that all such variations and modifications fall within the scope of the following claims.

What I claim is:

1. A passive recognition tag for use in an item identification system, comprising:

a SAW substrate having a sync transducer and a plurality of consecutive tap transducers aligned thereon along a SAW propagation path extending parallel to a single positive bus on one side of the transducers and a single negative bus on the opposite side of the transducers, with each transducer having electrodes which extend between the buses for substantially the distance existing therebetween and the transducers being connected in parallel across the buses; and an antenna having positive and negative terminals which are separately connected to the positive bus and negative bus respective;

whereby a first SAW is directed from the sync transducer to the consecutive tap transducers and a second SAW is directed from the consecutive tap transducers to the sync transducer when an interrogating signal is externally applied to the antenna and an identification code signal is derived with identical signal contributions that pass in phase to the antenna from the sync transducer and the consecutive tap transducers.

2. The recognition tag of claim 1 wherein the sync transducer is dispose along the propagation path to provide for SAW outputs therefrom and SAW inputs thereto on both sides thereof and the sequence of consecutive tap transducers is alternately distributed across the sync transducer to achieve a SAW propagation distance between the consecutive tap transducers which is of considerably less magnitude than the spacing utilized between the tap transducers on each side of the sync transducer and thereby overcome acoustic reflection difficulties between the consecutive tap transducers.

3. The recognition tag of claim 1 wherein the signal contributions are RF pulses having amplitudes that are gain correlated relative to a particular coded interrogating signal.

4. An item identification system, comprising:

at least one passive recognition tag for transmitting item identification code signals, each recognition tag including a SAW substrate having a sync transducer and a plurality of consecutive tap transducers arranged thereon along a SAW propagation path extending parallel to a single positive bus on one side of the transducers and a single negative bus on the opposite side of the transducers, with each transducer having electrodes which extend between the buses for substantially the distance existing therebetween and the transducers being connected in parallel across the busses and an antenna having positive and negative terminals which are separately connected to the positive bus and negative bus respectively, whereby a first SAW is directed from the sync transducer to the consecutive tap transducers and a second SAW is directed from the consecutive tap transducers to the sync transducer when an interrogating signal is externally applied to the antenna and an identification code signal is derived with identical signal contributions that pass in phase to the antenna from the sync transducer and the consecutive tap transducers;

a transceiver for both transmitting the interrogating signal to a location of interest and receiving the item identification code signals from the location of interest, through a common directional antenna; and means for discriminating as to the identification code signals which are received by the transceiver.

5. The item identification system of claim 4 wherein the sync transducer is dispose along the propagation path to provide for SAW outputs therefrom and SAW inputs thereto on both sides thereof and the sequence of consecutive tap transducers is alternately distributed across the sync transducer to achieve a SAW propagation distance between the consecutive tap transducers which is of considerably less magnitude than the spacing utilized between the tap transducers on each side of the sync transducer and thereby overcome acoustic reflection difficulties between the consecutive tap transducers.

6. The item identification system of claim 4 wherein a particular code is phase modulated on a coherent carrier to derive the interrogating signal and the recognition tags dedicated to that phase modulated code, respond thereto by deriving RF pulses as the signal contributions.

* * * * *